(12) United States Patent
Zhao et al.

(10) Patent No.: US 10,326,181 B2
(45) Date of Patent: *Jun. 18, 2019

(54) CONNECTOR ASSEMBLY FOR A BATTERY SYSTEM

(71) Applicants: TE CONNECTIVITY CORPORATION, Berwyn, PA (US); TYCO ELECTRONICS JAPAN G.K., Kawasaki-shi (JP)

(72) Inventors: Weiping Zhao, Superior Township, MI (US); Haifeng Liu, Kanagawa (JP)

(73) Assignees: TE CONNECTIVITY CORPORATION, Berwyn, PA (US); TYCO ELECTRONICS JAPAN G.K., Kawasaki-Shi (JP)

( * ) Notice: Subject to any disclaimer, the term of this patent is extended or adjusted under 35 U.S.C. 154(b) by 173 days.

This patent is subject to a terminal disclaimer.

(21) Appl. No.: 15/343,429

(22) Filed: Nov. 4, 2016

(65) Prior Publication Data

US 2018/0131047 A1   May 10, 2018

(51) Int. Cl.
*H01M 10/48* (2006.01)
*G01R 31/364* (2019.01)
*H01M 2/10* (2006.01)
*H01M 2/20* (2006.01)
*B60L 11/18* (2006.01)

(52) U.S. Cl.
CPC ........ *H01M 10/482* (2013.01); *G01R 31/364* (2019.01); *H01M 2/1077* (2013.01); *H01M 2/206* (2013.01); *B60L 11/1861* (2013.01); *H01M 2220/20* (2013.01)

(58) Field of Classification Search
CPC .. H01M 10/482; H01M 2/1077; H01M 2/206; H01M 2220/20
See application file for complete search history.

(56) References Cited

U.S. PATENT DOCUMENTS

2013/0010449 A1   1/2013   Ikeda et al.

FOREIGN PATENT DOCUMENTS

| CN | 102859754 B | 1/2013 |
|----|-------------|--------|
| DE | 102015225233 A1 | 6/2016 |
| WO | 2017163187 A1 | 9/2017 |

OTHER PUBLICATIONS

International Search Report, International Application No. PCT/IB2017/056888, International Filing Date Nov. 3, 2017.

*Primary Examiner* — Jane J Rhee

(57) ABSTRACT

A connector assembly for voltage monitoring battery cells of a battery module includes a connector having a plurality of terminals and a wire assembly extending from the connector along a wire axis. The wire assembly has a plurality of wires extending between a terminal end and a buss bar end. The terminal end is terminated to a corresponding terminal. The buss bar end is configured to be terminated to a voltage sensor associated with a corresponding buss bar of the battery module. The buss bar end is folded over such that the buss bar end extends at a transverse angle relative to the wire axis. The buss bar ends are staggered along the wire axis at different depths from the connector.

20 Claims, 7 Drawing Sheets

CONNECTOR ASSEMBLY FOR A BATTERY SYSTEM

BACKGROUND OF THE INVENTION

The subject matter herein relates generally to battery connector systems.

Battery modules, such as those for electric vehicles or hybrid vehicles, typically includes a plurality of cells grouped together to form the battery modules. The battery modules are connected together to form battery packs. Each of the cells includes positive and negative cell terminals that are electrically connected together. The positive and negative cell terminals are connected using buss bars. Some systems are designed to monitor aspects of the battery cells, such as voltage, temperature and the like. Such systems provide sensors that are connected to a monitoring circuit. Round wires are typically connected to the sensors as parts of wire harnesses that interconnect the sensors and the monitoring circuit. Providing the round wires between each of the cells or buss bars and the monitoring unit adds bulk to the battery modules, particularly where the wires a stacked up and routed through the system. The wire harnesses are at risk for damage to the wires. Some systems use flexible printed circuits to reduce the thickness of the wires connecting to the buss bars. However flexible printed circuits are expensive and redesign or re-routing of the circuits can be expensive.

A need remains for battery modules that use low cost, flexible flat cables or wires for termination to components of the battery monitoring system.

BRIEF DESCRIPTION OF THE INVENTION

In one embodiment, a connector assembly is provided for voltage monitoring battery cells of a battery module that includes a connector having a plurality of terminals and a wire assembly extending from the connector along a wire axis. The wire assembly has a plurality of wires extending between a terminal end and a buss bar end. The terminal end is terminated to a corresponding terminal. The buss bar end is configured to be terminated to a voltage sensor associated with a corresponding buss bar of the battery module. The buss bar end is folded over such that the buss bar end extends at a transverse angle relative to the wire axis. The buss bar ends are staggered along the wire axis at different depths from the connector.

In a further embodiment, a carrier assembly is provided for battery cells of a battery module that includes a tray configured to be coupled to a top of the battery module over the battery cells. The tray holds a plurality of buss bars configured to electrically connect adjacent battery cells of the battery module. The buss bars have voltage sensors associated therewith. The buss bars have strain relief tabs extending therefrom proximate to the voltage sensors. The carrier assembly includes a connector assembly coupled to the tray. The connector assembly has a connector including a plurality of terminals and a wire assembly extending from the connector along a wire axis. The wire assembly has a plurality of wires extending between a terminal end and a buss bar end. The terminal end is terminated to a corresponding terminal. The buss bar ends are staggered along the wire axis at different depths from the connector. The buss bar ends are folded over such that the buss bar ends extend at transverse angles relative to the wire axis to the corresponding voltage sensors. The buss bar ends are fixed relative to the voltage sensors of the buss bars by the strain relief tabs.

In another embodiment, a battery system is provided including a plurality of battery cells forming a battery module being stacked in a cell stack-up direction. A carrier assembly is mounted to the battery module. The carrier assembly has a tray holding a plurality of buss bars for electrically connecting adjacent battery cells of the battery module. The buss bars have voltage sensors sensing a voltage of the corresponding buss bar. A connector assembly is coupled to the tray. The connector assembly has a connector including a plurality of terminals and a wire assembly extending from the connector along a wire axis. The wire assembly has a plurality of wires extending between a terminal end and a buss bar end. The terminal end is terminated to a corresponding terminal. The buss bar ends are staggered along the wire axis at different depths from the connector. The buss bar ends are folded over such that the buss bar ends extend at transverse angles relative to the wire axis to the corresponding voltage sensors. The buss bar ends are fixed relative to the voltage sensors of the buss bars by the strain relief tabs.

DETAILED DESCRIPTION OF THE INVENTION

Figure 1:
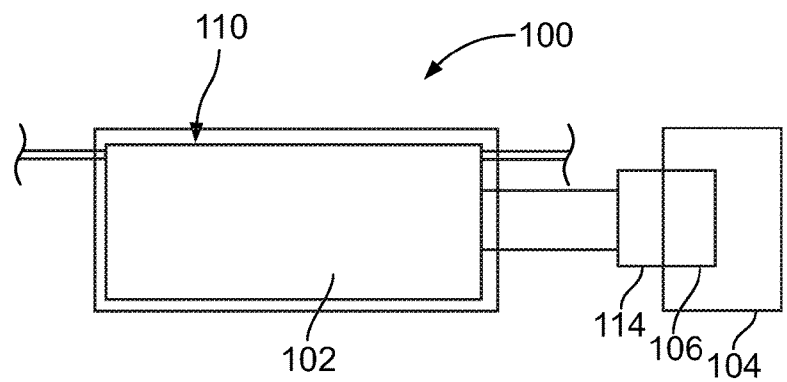
FIG. 1 is a schematic view of a battery system formed in accordance with an exemplary embodiment.

FIG. 1 is a top perspective view of a battery system 100 formed in accordance with an exemplary embodiment. The battery system 100 includes one or more battery modules 102 with corresponding carrier assemblies 110 mounted to the battery module(s) 102. The battery modules 102 may be stacked together as a battery pack used as part of the battery system 100, such as a battery system in a vehicle, such as an electric vehicle or a hybrid electrical vehicle. The battery system 100 may be used in other applications in alternative embodiments. The battery modules 102 may be contained within a housing.

The battery system 100 includes a battery control module 104, which may be mounted near to the battery module(s)

102. The battery control module 104 controls activities of the battery modules 102. The battery control module 104 may include or communicate with a vehicle system controller to verify that the battery module 102 is operating within the parameters set for the current condition of the battery module 102. The battery control module 104 may monitor the voltage of the cells of the battery module 102. The battery control module 104 may monitor the temperature of the battery module 102. The battery control module 104 may supply fault codes to the vehicle. The battery control module 104 may be mounted above the battery module 102 or may be provided elsewhere, such as along a side of the battery module 102 or remote from the battery module 102.

The battery system 100 includes one or more connector assemblies 114 coupled to the battery control module 104, such as to corresponding control module connectors 106 of the battery control module 104. The connector assemblies 114 are electrically coupled to voltage sensors, temperature sensors and the like within the battery module 102 and routed to the battery control module 104.

Figure 2:
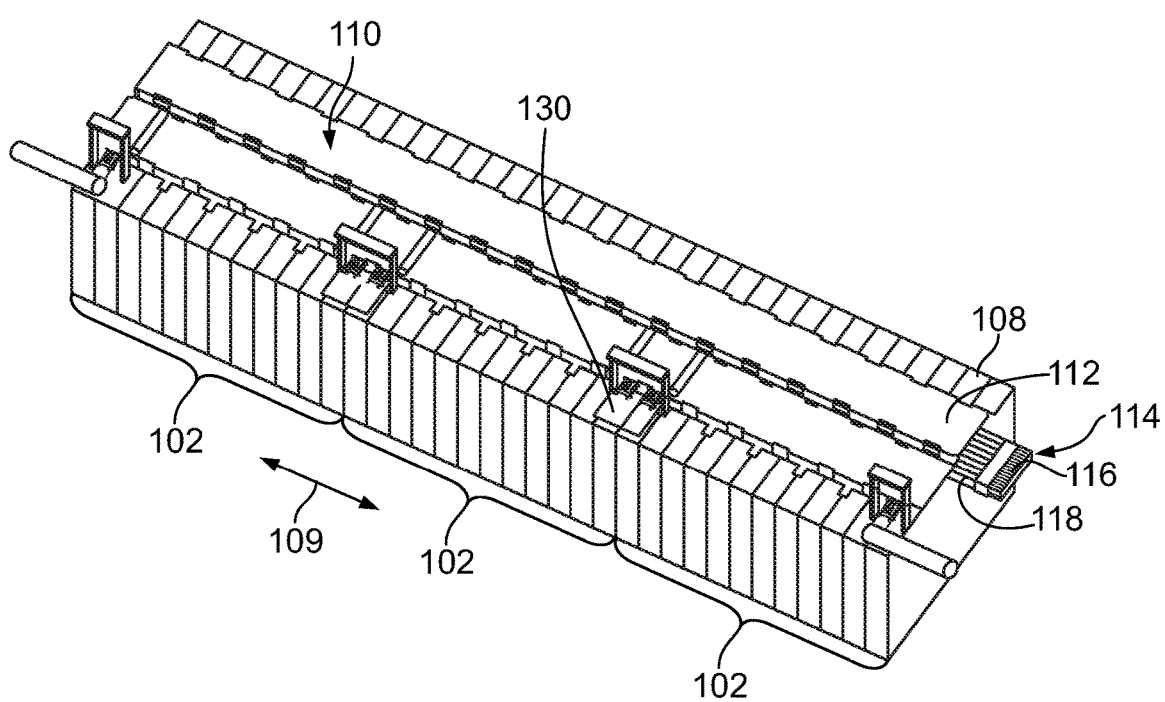
FIG. 2 is a top perspective view of battery modules of the battery system.

FIG. 2 is a top perspective view of a group of battery modules 102. The battery module 102 includes a plurality of battery cells 108, such as prismatic battery cells. The battery cells 108 are arranged in a stacked configuration, side-by-side, to form the battery module 102. The battery cells 108 are stacked in a cell stack-up direction 109. Optional, the battery module 102 may include a case or other housing that holds the battery cells 108. A battery cover may be provided over the tops of the battery cells 108. The battery cover may cover each of the battery cells 108.

Each battery module 102 includes a positive battery terminal and a negative battery terminal. The battery terminals are configured to be coupled to external power cables or alternatively may be bussed to battery terminals of another battery module 102. Optionally, the battery terminals may be connected using quick-connection types of connectors.

The carrier assembly 110 is provided over the battery module 102. The carrier assembly 110 holds the one or more connector assemblies 114. The carrier assembly 110 includes one or more trays 112 holding a plurality of buss bars 130 (shown in FIG. 4). The buss bars 130 have voltage sensors associated therewith. The connector assembly 114 is electrically connected to corresponding voltage sensors for monitoring voltage of the buss bars 130 and the battery cells 108.

The connector assembly 114 includes a connector 116 and a wire assembly 118 terminated to corresponding terminals held in the connector 116. The wire assembly 118 includes a plurality of wires 140 terminated to corresponding terminals and corresponding buss bars 130. The connector 116 is configured to be mated with the corresponding control module connector 106 (shown in FIG. 1) of the battery control module 104 (shown in FIG. 1). The connector assembly 114 is electrically connected to the buss bars 130 to monitor the voltage of the corresponding battery cells 108 of the battery module 102 by measuring the voltage across the buss bar 130 between the associated battery cells 108. For example, the plurality of wires 140 of the wire assembly 118 may be electrically connected to corresponding buss bars 130. The wire assembly 118 may be a flat flexible cable. The wire assembly 118 may be a multi-wire planar cable. The wire assembly 118 may include a plurality of discrete wires arranged together as a wire harness. For example, the wires may be secured together by a wire tie, a clip or another device to hold the wires together. Portions of the wires 140 of the wire assembly 118 may be separable from the group of wires, such as for termination to the terminals or the buss bars 130.

Figure 3:
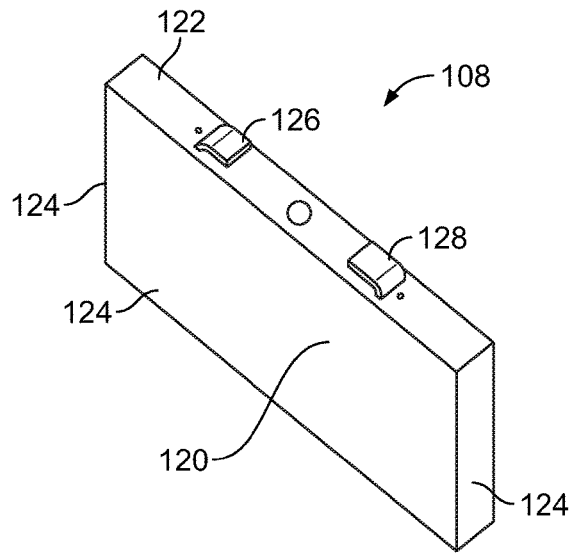
FIG. 3 is a top perspective view of a battery cell of the battery module formed in accordance with exemplary embodiment.

FIG. 3 is a top perspective view of one of the battery cells 108 formed in accordance with exemplary embodiment. The battery cell 108 includes a cell housing 120 having a top 122 and side walls 124. In the illustrated embodiment, the cell housing 120 is boxed shaped having four side walls 124.

The battery cell 108 includes a positive cell terminal 126 and a negative cell terminal 128. In the illustrated embodiment, the terminals 126, 128 include flat pads having upper surfaces that define connection interfaces for electrical connection to corresponding buss bars 130 (shown in FIG. 4).

Figure 4:
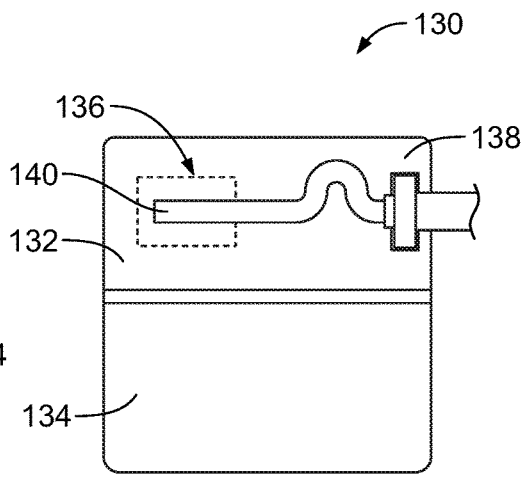
FIG. 4 is a top perspective view of a buss bar of the battery module formed in accordance with an exemplary embodiment.

FIG. 4 is a top perspective view of one of the buss bars 130 formed in accordance with an exemplary embodiment. The buss bar 130 is used to electrically connect the cell terminals 126 or 128 (shown in FIG. 3) of adjacent battery cells 108 (shown in FIG. 2).

The buss bar 130 includes a positive plate 132 and a negative plate 134. The positive plate 132 is configured to be terminated to a corresponding positive cell terminal 126 of one battery cell 108 and the negative plate 134 is configured to be terminated to a corresponding negative cell terminal 128 of the adjacent battery cell 108. Optionally, the positive and negative plates 132, 134 may be of different metals, such as aluminum and copper.

The buss bar 130 includes a voltage sensor 136 associated therewith. For example, the voltage sensor 136 may be an integral part of the buss bar 130 that is electrically connected to the connector assembly 114 for voltage monitoring. In other various embodiments, the voltage sensor may be a separate component or connector connected to the buss bar 130. In the illustrated embodiment, the voltage sensor 136 is defined by a pad on the surface of one of the plates, such as the negative plate 134, which may be used to solder or weld the wire to the voltage sensor 136. In various other embodiments, the voltage sensor 136 may be a tab or protrusion extending from one of the plates, such as from an edge or a side of the buss bar 130. Optionally, such tab or protrusion may be stamped and formed with the buss bar 130. The voltage plate may be folded or formed into a barrel shape to receive the wire. In alternative embodiments, the voltage sensor 136 may be a separate component coupled to the buss bar 130, such as by being soldered, welded, fastened or otherwise secured to the buss bar 130. In an exemplary embodiment, the voltage sensor 136 constitutes a weld tab configured to receive one of the wires 140 of the connector assembly 114 (shown in FIG. 1), which is welded to the weld tab. Welding provides a reliable connection with the wire 140 for accurate, reliable sensing. Other types of contacts other than the weld tab may be provided in alternative embodiments to define the voltage sensor 136 to connect to a corresponding component of the connector assembly 114, such as a crimp barrel, an insulation displacement contact, a spring contact, a pin, a socket, a poke-in wire connection, and the like. The wire 140 may be affixed to the buss bar 130, such as be crimping, welding, soldering, using conductive adhesive, and the like in other alternative embodiments.

In various embodiments, the buss bar 130 may include a strain relief tab 138 for securing the wire 140 to the buss bar 130, such as to reduce strain at the connection point of the wire 140 to the voltage sensor 136. For example, the strain relief tab 138 may reduce strain at the weld point between the wire 140 and the buss bar 130. In the illustrated embodiment, the strain relief tab 138 is a tab configured to be folded over to pinch the insulation of the wire 140 near the voltage sensor 136. Other types of strain relief tabs may be provided in alternative embodiments. The strain relief tab 138 may be stamped from and folded out of an interior portion one of the plates 132 or 134. Alternatively, the strain relief tab 138 may extend from an edge of one of the plates 132, 134. The strain relief tab 138 may be coupled to the plates 132 or 134 by a glue or adhesive to secure the wire 140 to the bus bar 130.

Figure 5:
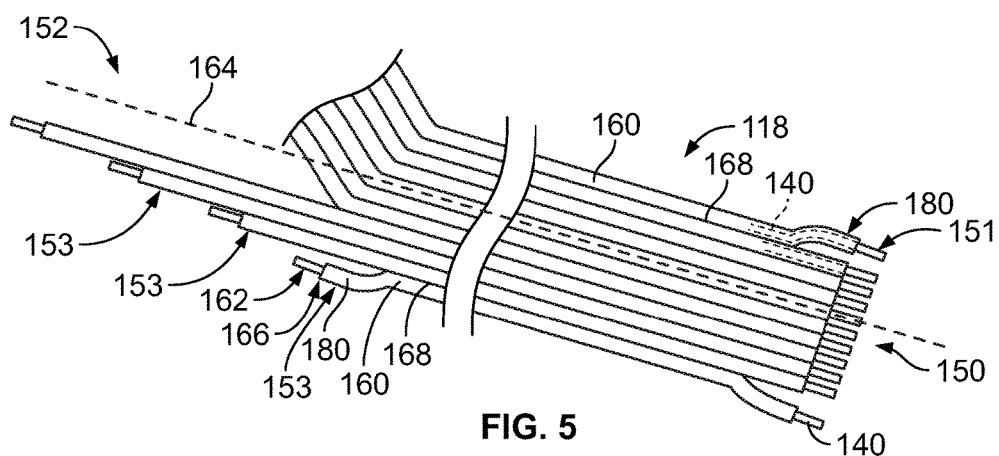
FIG. 5 is a top view of a cable in accordance with an exemplary embodiment.
Figure 6:
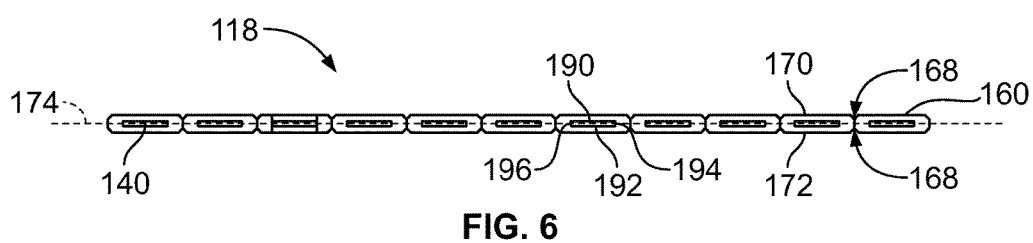
FIG. 6 is a cross-sectional view of the cable.

FIG. 5 is a top view of the wire assembly 118 in accordance with an exemplary embodiment. FIG. 6 is a cross-sectional view of the wire assembly 118. The wire assembly 118 extends between a connector end 150 and a sensor end 152. The wires 140 each have terminal ends 151 at the connector end 150 configured to be terminated to corresponding terminals. The wires 140 each have buss bar ends 153 at the sensor end 152 configured to be terminated to corresponding buss bars 130 (shown in FIG. 4). The wires 140 at the connector end 150 are configured to be terminated to corresponding terminals of the connector 116 (shown in FIG. 2). The wires 140 at the buss bar end 153 are configured to be terminated to corresponding voltage sensors 136 (shown in FIG. 4).

The wire assembly 118 has a plurality of the wires 140. In an exemplary embodiment, the wire assembly 118 is a multi-wire planar cable having the plurality of wires 140 arranged within a common jacket 160 for the plurality of wires 140. The wires 140 are metal conductors, which may be flat wires having a rectangular cross-section. In the illustrated embodiment, the wire assembly 118 is flat or planar. The wire assembly 118 is flexible. Alternatively, the wire assembly 118 may be a wire harness having a plurality of discrete wires 140, which may be fixed together, such as with a clip or tie.

The wire assembly 118 has the wires 140 arranged in a stacked arrangement with the wires 140 side-by-side. As such, the wire assembly 118 may have a low profile, such as for arrangement in the tray 112 of the carrier assembly 110. Optionally, each wire 140 is connected together as a unit by the common jacket 160. In an exemplary embodiment, the sensor end 152 of the wire assembly 118 is stepped such that each of the wires 140 have different lengths. For example, the wires 140 are progressively shorter or progressively longer from the outer side of the wire assembly 118. The lengths of the wires 140 between the terminal ends 151 and the buss bar ends 153 may vary. For example, each buss bar end 153 may be at a different depth from the connector 116.

The wires 140 have terminating portions 162 at the buss bar ends 153. In an exemplary embodiment, the terminating portions 162 are exposed at the buss bar ends 153 for termination to the buss bars 130, such as by welding to the buss bars 130. For example, portions of the jacket material surrounding the end of the wire 140 are removed to expose the wire 140. The terminating portions 162 are staggered along a wire axis 164 of the wire assembly 118. For example, the staggering of the terminating portions 162 defines the stepped sensor end 152. In an exemplary embodiment, the terminating portions 162 are provided at distal ends of the wires 140, which are provided at different distances from the connector end 150 and the connector 116.

Optionally, the wires 140 may be separated from each other for a length at the connector end 150 and/or the sensor end 152. For example, each buss bar end 153 may be separated from the other wires 140 and the main jacket 160. Such separated portions allow the wires 140 to be independently movable relative to the other wires 140, such as for termination to the buss bars 130. For example, the separated portions may be torn or cut to separate portions of the wires 140. The separated portions may be referred to as cablets 166 of the wire assembly 118. For example, each buss bar end 153 may define a different cablet 166 of the wire assembly 118. Portions of the wires 140 may be removed downstream of the cablets 166 to define the staggered sensor end 152 of the wire assembly 118. As such, the cablets 166 may be staggered along the wire axis 164. Each cablet 166 has one of the wires 140 and the corresponding portion of the material of the jacket 160. The cablets 166 are independently movable relative to each other. The cablets 166 each include the corresponding exposed portion of the wire 140 defining the terminating portion 162 and may include at least a segment of the jacketed portion defining an insulating sleeve around the wire 140.

In an exemplary embodiment, the wire assembly 118 includes grooves 168 in the jacket 160. The cablets 166 may be separated at the grooves 168. The grooves 168 may be centered between adjacent wires 140. The grooves 168 may be V-shaped to force separation at the point of the groove 168, such as along the bisector line between the grooves 168. The grooves 168 define boundaries between the wires 140 and force separation to occur along the grooves 168. Without the grooves, tearing or cutting may wander away from one wire 140 and toward another wire 140 leading to some wires 140 have more jacketing material and other wires 140 having less jacketing material. Without controlled separation, portions of the wires 140 may be exposed by the tearing or cutting. In other various embodiments, the wire assembly 118 may be provided without the grooves 168 defined between the wires 140. In such embodiments, the cablets 166 may be separated mechanically, such as with a cutting knife, a laser cutter or other type of device.

The jacket 160 is insulative and made from a dielectric material, such as polyurethane, polyvinylchloride, chlorinated polyethylene, thermoplastic elastomer, rubber, and the like. The jacket 160 has a top surface 170 and a bottom surface 172 opposite the top surface 170. The top and bottom surfaces 170, 172 are generally planar. A cable plane 174 (FIG. 6) of the wire assembly 118 is defined between the top and bottom surfaces 170, 172. The jacket 160 has a thickness between the top and bottom surfaces 170, 172. The thickness is relatively small compared to a length and a width of the wire assembly 118. The thickness may be reduced at the grooves 168. For example, the thickness may be reduced by approximately 10%, by approximately 30%, by approximately 50%, or more at the grooves 168. Optionally, the grooves 168 may be provided on both the top surface 170 and the bottom surface 172; however the grooves 168 may be provided on only the top surface 170 or the bottom surface 172 in alternative embodiments. The grooves 168 may be aligned with each other across the wire assembly 118 in an exemplary embodiment.

In an exemplary embodiment, the cablets 166 have jacket portions 180 surrounding the wires 140 that define insulating sleeves and may be referred to hereinafter as insulating sleeves 180. The insulating sleeves 180 extend a length of the wires 140 to separation points along the jacket 160 where the jacket portion 180 breaks off from the jacket 160. The terminating portions 162 of the wires 140 are exposed beyond the insulating sleeves 180 at distal ends of the wires 140 for termination to the voltage sensor 136. Alternatively, rather than exposing the terminating portions 162 beyond the insulating sleeves 180, the terminating portions 162 may be exposed through the insulating sleeve 180, such as from the top surface 170 and/or the bottom surface 172. For example, a portion of the jacket portion 180 may be removed to define a window exposing the wire 140. The exposed portion of the wire 140 may be electrically connected to the terminal or the voltage sensor 136. In other various embodiments, the wire 140 may be electrically connected to the voltage sensor 136 by the voltage sensor 136 piercing the jacket 160. For example, the voltage sensor 136 may be terminated by a pierce crimp.

The wires 140 have an upper flat side 190, a lower flat side 192 and opposite first and second edges 194, 196 between the flat sides 190, 192. In an exemplary embodiment, the insulating sleeves 180 surround the sides 190, 192 and the edges 194, 196 to ensure that no portion of the wires 140 are exposed, which could lead to a short circuit or arcing.

Figure 7:
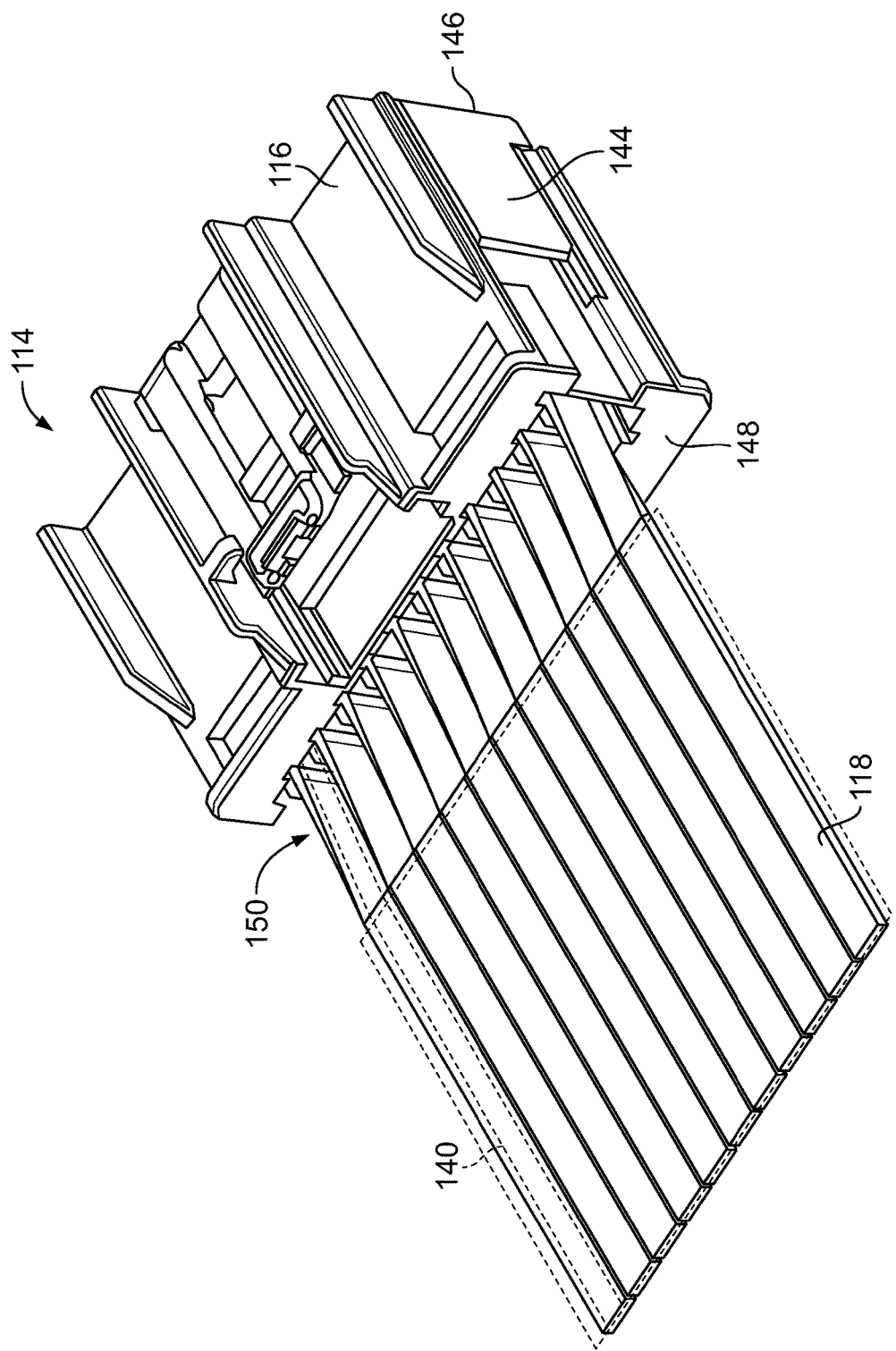
FIG. 7 is a perspective view of a portion of a connector assembly of the battery system.

FIG. 7 is a perspective view of a portion of the connector assembly 114. The connector assembly 114 includes the connector 116 provided at the connector end 150 of the wire assembly 118. The wire assembly 118 includes a plurality of the wires 140, which are connected to corresponding voltage sensors 136 (shown in FIG. 4) and to corresponding terminals of the connector 116.

The connector 116 includes a housing 144 holding the terminals (not shown). The housing 144 extends between a front 146 and a rear 148. The front 146 defines a mating end of the connector 116 configured for mating with the control module connector 106 (shown in FIG. 1).

Figure 8:
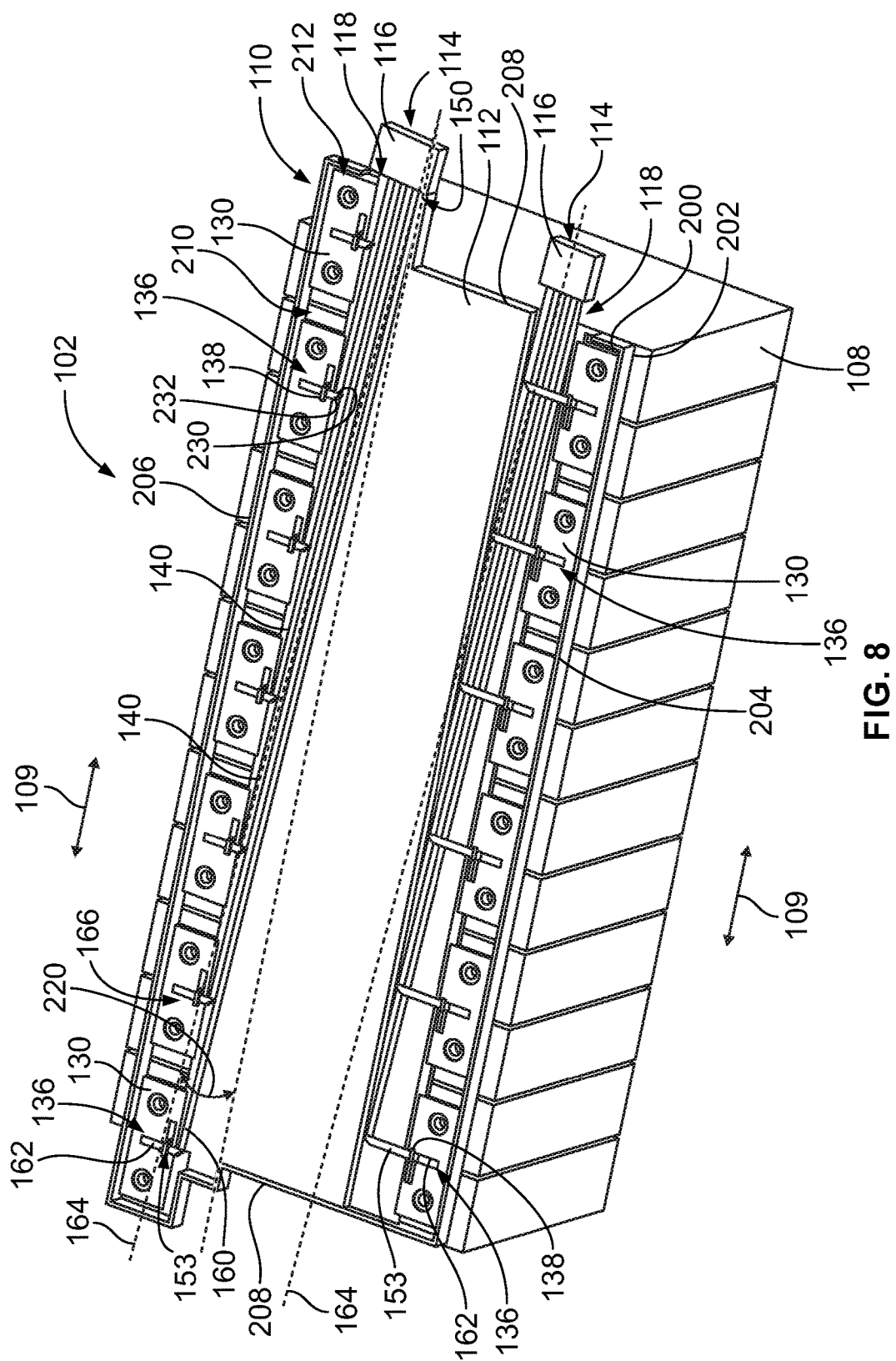
FIG. 8 is a front perspective view of a carrier assembly mounted to a battery module of the battery system including a plurality of the connector assemblies.
Figure 9:
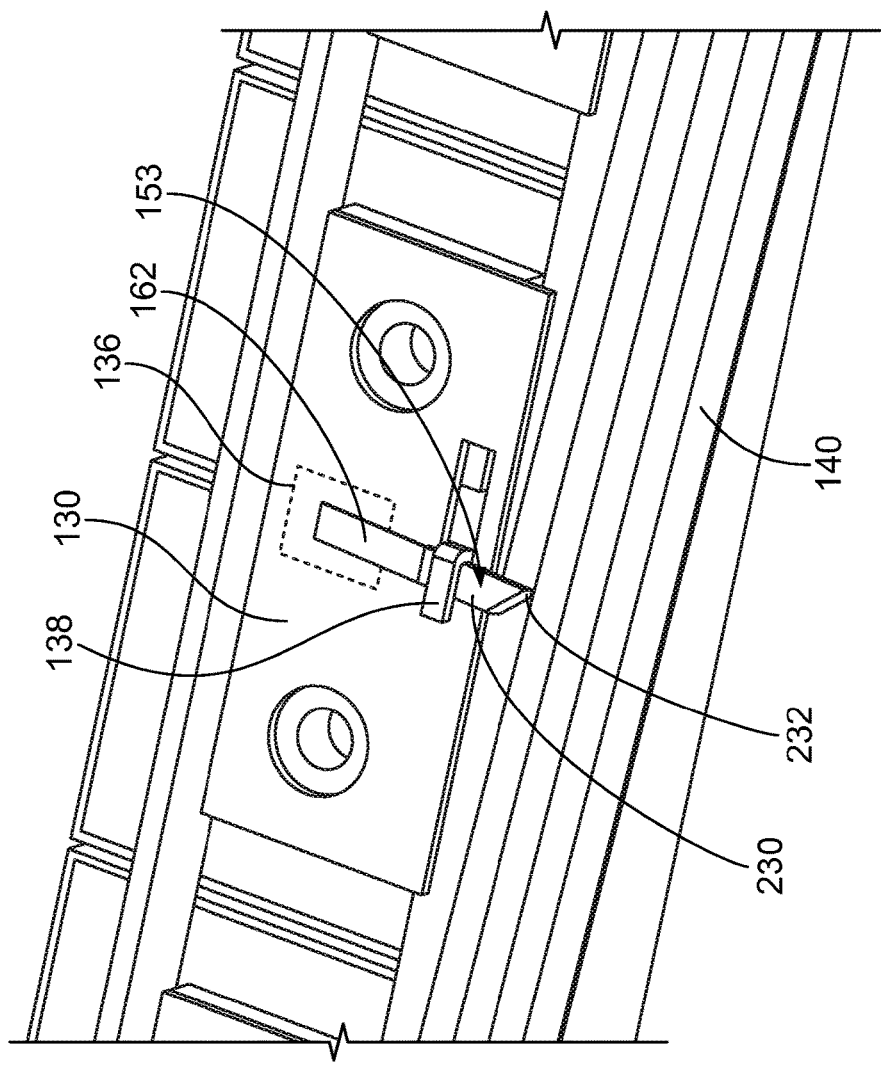
FIG. 9 is an enlarged perspective view of a portion of the carrier assembly in accordance with an exemplary embodiment.

FIG. 8 is a front perspective view of the carrier assembly 110 and a plurality of the connector assemblies 114 mounted to a battery module 102. FIG. 9 is an enlarged perspective view of a portion of the carrier assembly 110. The carrier assembly 110 includes the tray 112 holding the buss bars 130. The tray 112 includes a top 200 and a bottom 202. The bottom 202 is configured to be mounted to the battery module 102. The tray 112 includes a front 204 and a rear 206 with sides 208 therebetween. A cover may be coupled to the tray 112 at the top 200 to cover the wire assembly 118.

The tray 112 includes pockets 210 receiving corresponding buss bars 130. Optionally, the pockets 210 may be positioned generally along the front 204 and the rear 206. The tray 112 includes channels 212 extending between various pockets 210. The cables 118 may be routed in the channels 212 to interface with the corresponding buss bars 130.

In an exemplary embodiment, the sensor end 152 of the wire assembly 118 is stepped such that the buss bar ends 153 and the corresponding terminating portions 162 are staggered. Each buss bar end 153 is defined by a section of the wire 140 that is separated from the other sections. The buss bar end 153 may be separated from the jacket 160 for termination to the buss bars 130. The buss bar ends 153 may be cut to length, separated and or stripped prior to positioning in the tray 112 and terminating to the buss bars 130. The wires 140 have different lengths such that the terminating portions 162 are staggered at different depths from the connector 116 to extend to the different buss bars 130 for termination to different voltage sensors 136. Optionally, the wire assembly 118 may be branched in multiple directions, such as opposite directions such that the connector 116 may be approximately centered relative to the battery module 102 as opposed to being provided at the end of the battery module 102. Optionally, multiple cables 118 may be stacked or cross over each other as the cables 118 are routed within the tray 112 to the connector 116. The cables 118 may be folded over to change a routing direction of the wire assembly 118. In an exemplary embodiment, each of the buss bar ends 153 are folded over to extend from the root portion of the wire assembly 118 to the corresponding buss bar 130. For example, the buss bar ends 153 may be bent over or under and then angled toward the corresponding buss bar 130. The buss bar ends 153 may be folded and routed transverse to the cell stack-up direction 109. The buss bar ends 153 may be folded and routed transverse to the wire axis 164. For example, the buss bar ends 153 may be angled non-parallel to the wire axis 164. The buss bar ends 153 may be angled generally perpendicular to the wire axis 164. The buss bar ends 153 may be angled at other angles, such as a 45° angle, to the wire axis 164. Optionally, some wires 140 of the wire assembly 118 may be routed to sensors other than voltage sensors, such as a temperature sensor. In alternative embodiments, rather than having multiple connector assemblies 114, a single connector assembly may be used with wires 140 routed to the buss bars 130 on both the front and the rear of the carrier assembly 110.

In an exemplary embodiment, the wire assembly 118 is arranged in the tray 112 at an alignment angle 220 relative to the cell stack-up direction 109. For example, the wire assembly 118 is angled such that the wire axis 164 is non-parallel to the cell stack-up direction 109. Angling the wire assembly 118 along the wire axis 164 positions the buss bar ends 153 and the terminating portions 162 relative to the buss bars 130 for ease of routing the buss bar ends 153 to the corresponding buss bars 130. For example, because the sensor end 152 is stepped with the buss bar ends 153 being staggered along the length of the wire assembly 118 (e.g., along the wire axis 164) and staggered across the wire assembly 118 (e.g., side-to-side), the wire assembly 118 is angled to successively align the buss bar ends 153 and the terminating portions 162 with the corresponding buss bars 130. The buss bars 130 are stacked in the cell stack-up direction 109 along the stack of battery cells 108. The wire assembly 118 may be angled from the connector 116 toward the buss bar 130 or may be angled away from the connector 116 to align with the voltage sensor 136. For example, the inner-most wire 140 (relative to the center of the tray 112) may be angled from the connector 116 to the corresponding buss bar 130 (e.g., the end-most buss bar 130 furthest from the connector 116). The wire 140 immediately inside of the inner-most wire 140 may be angled from the connector 116 to the corresponding buss bar 130 (e.g., the second buss bar from the end), and so on down the line of wires 140 and buss bars 130. The wires 140 of the wire assembly 118 are angled relative to the buss bars 130 (e.g., angled relative to the edge of the buss bar 130).

The alignment angle 220 may be any non-parallel angle relative to the cell stack-up direction 109. The alignment angle 220 may be determined based on a pitch 222 between terminating portions 162 (e.g., the distance between the weld points of the terminating portions 162), or alternatively, the length of the longest wire 140 (e.g., the distance from the connector 116 to the weld point of the longest wire 140). The alignment angle 220 may be determined based on a width 224 of each cablet 166, or alternatively the cumulative width of the cablets 166 which is the width of the wire assembly 118. The alignment angle 220 may be selected for convenience of the manufacturing process, such as the wire termination process.

In alternative embodiments, rather than angling the wire assembly 118, the wire axis 164 may be parallel to the cell stack-up direction 109 and the buss bar ends 153 may be bent or folded to direct the terminating portions 162 toward the voltage sensors 136. The buss bar ends 153 may extend at any angle to position the terminating portions 162 relative to the buss bars 130.

In an exemplary embodiment, the buss bars 130 are identical to each other and positioned at the same locations relative to the battery cells 108 (e.g., the same distance from the front 204 of the tray 112 and/or the same distance from the outer edge of the battery cells 108). The connector 116 is positioned generally laterally interior of the buss bars 130, such as closer to the center of the tray 112. As such, the inner-most wire 140 is positioned further laterally interior of the outer-most wire 140, which is positioned closest to the buss bars 130. In order for each of the terminating portions 162 to be terminated at the same locations of the corresponding buss bars 130, the wire assembly 118 is angled at the alignment angle 220. Having each of the terminating portions 162 terminated to the same location of the corresponding buss bars 130 makes manufacture and assembly easier. For example, the laser weld tool used to laser weld the exposed terminating portions 162 to the voltage sensors 136 may be easily positioned relative to the terminating portions 162. For example, the laser weld tool may only move in a linear direction along the terminating axis which is along with cell stack up direction 109 and does not need to shift laterally to align with the terminating portions 162. The buss bars 130 may all be identical as the voltage sensors 136 may all be positioned at the same location and do not need to be shifted laterally to line up with staggered terminating portions (which would be the case if the wire termination portion 162 of the wire assembly 118 were parallel to the cell stack-up direction 109).

In an exemplary embodiment, connector assemblies 114 are provided along both the front 204 and the rear 206 of the tray 112. The first and second connector assemblies 114 have the connectors 116 at the same side of the battery module 102 with the cables 118 extending toward the opposite side of the battery module 102. The first wire assembly 118 is terminated to the buss bars 130 at the front 204 and the second wire assembly 118 is terminated to the buss bars 130 at the rear 206. The cables 118 are angled away from each other. For example, the wire assembly 118 closer to the front 204 is angled toward the front 204 and the wire assembly 118 toward the rear 206 is angled toward the rear 206. The distal ends of the cables 118 are further apart than the connector ends 150 of the cables 118.

In an exemplary embodiment, such as shown in FIG. 9, the buss bar ends 153 include strain relief portions 230. The strain relief portions 230 are provided near the terminating portions 162 to provide strain relief at the buss bars 130. Optionally, each cablet 166 includes one of the strain relief portions 230. The strain relief portion 230 may be aligned with the corresponding buss bar 130, such as proximate to the termination point of the terminating portion 162 with the buss bar 130. The strain relief portion 230 may be defined by a segment of the buss bar ends 153. The strain relief portion 230 may lay flat along the buss bar 130 and be captured by the strain relief tab 138. Alternatively, the strain relief portion 230 may be bunched up to provide slack in the buss bar ends 153, such as to accommodate vibration or relative movement. For example, the strain relief portion 230 allows movement of the terminating portion 162 relative to other portions of the buss bar ends 153. For example, when the battery cell 108 and/or buss bar 130 is subject to expansion/contraction and/or vibration, the slack in the terminating portion 162 relieves stresses at the weld point. The strain relief portion 230 is provided downstream of a separation point 232 of the buss bar end 153 from the wire assembly 118. Optionally, the strain relief portion 230 may be provided between the strain relief tab 138 and the separation point 232. The strain relief tab 138 fixes the position of the terminating portion 162 relative to the buss bar 130, such as for termination to the voltage sensor 136, such as by laser welding. The strain relief tab 138 holds the bus bar end 153 and avoids overstress to the joint between bus bar 130 and termination portion 162 due to vibration, cell expansion/contraction, assembly, and shipping and handling. The joint can be any welding joint or mechanical joint or any joint which makes electrical connection between bus bar 130 and terminating portion 162.

Figure 10:
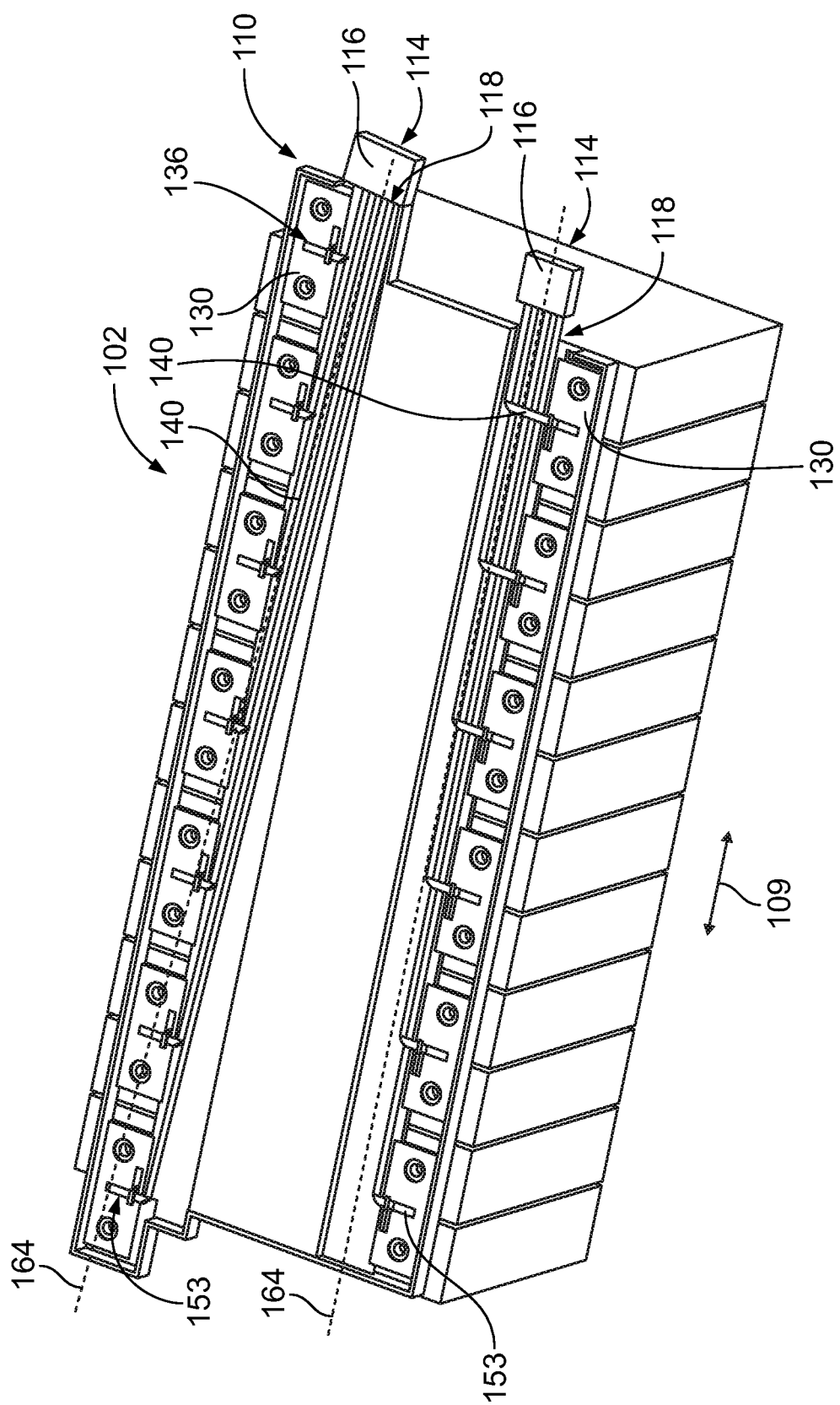
FIG. 10 is a front perspective view of a carrier assembly mounted to a battery module of the battery system including a plurality of the connector assemblies.

FIG. 10 is a front perspective view of the carrier assembly 110 and a plurality of the connector assemblies 114 mounted to a battery module 102. FIG. 10 illustrates the wire assemblies 118 at different orientations relative to the carrier assembly 110 than the embodiment illustrated in FIG. 8. For example, FIG. 8 illustrates the wire assemblies 118 angled transverse to the cell stack-up direction 109, with the wire axis 164 of the front wire assembly 118 angled non-parallel to the cell stack-up direction 109 and with the wire axis 164 of the rear wire assembly 118 angled non-parallel to the cell stack-up direction 109. In the embodiment of FIG. 8, the wire axes 164 are generally parallel to each other, such as with the wire axis 164 of the front wire assembly 118 angled away from the buss bars 130 and with wire axis 164 of the rear wire assembly 118 angled toward the buss bars 130; however other configurations are possible in alternative embodiments. For example, FIG. 10 illustrates the wire assemblies 118 in different orientations.

In the embodiment shown in FIG. 10, the wire assemblies 118 are angled at different angles relative to each other. For example, the wire axis 164 of the front wire assembly 118 is parallel to the cell stack-up direction 109, while the wire axis 164 of the rear wire assembly 118 is angled non-parallel to the cell stack-up direction 109. The wire axis 164 of the rear wire assembly 118 is angled toward the buss bars 130; however other configurations are possible in alternative embodiments.

In the embodiment shown in FIG. 10, for the front wire assembly 118, the wire 140 closest to the buss bars 130 is the longest wire (furthest depth from the connector 116). The other wires 140 are successively shorter with the shortest wire 140 being the wire furthest from the buss bars 130. The buss bar ends 153 of all or most of the wires 140 are folded over at least one other wire 140 as the buss bar ends 153 are routed to the corresponding voltage sensors 136. However, for the rear wire assembly 118, the wire 140 closest to the buss bars 130 is the shortest wire. The other wires 140 are successively longer with the longest wire 140 being the wire furthest from the buss bars 130. The buss bar ends 153 of all of the wires 140 are folded over toward the corresponding buss bars 130 without passing over any other wires 140.

Figure 11:
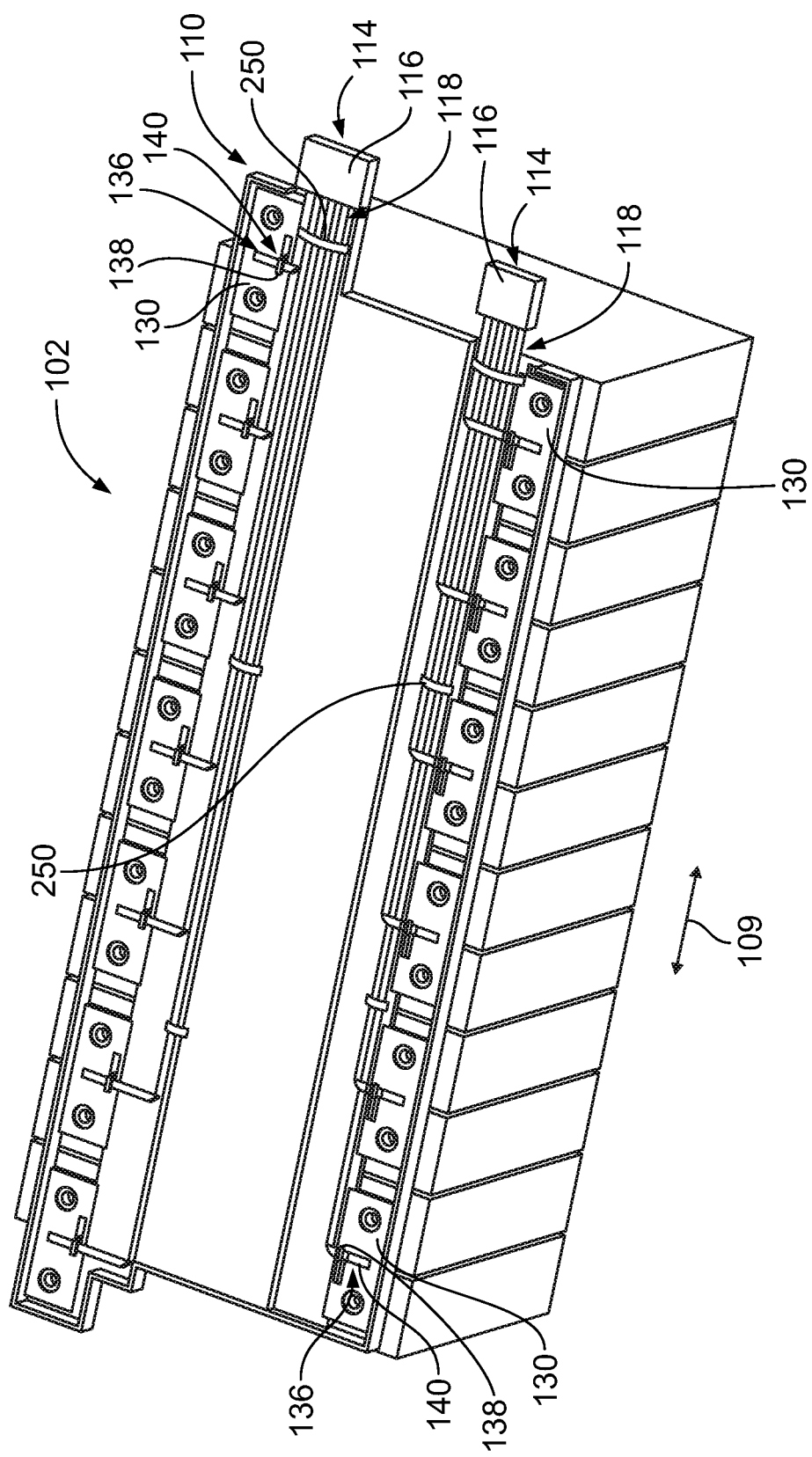
FIG. 11 is a front perspective view of a carrier assembly mounted to a battery module of the battery system including a plurality of the connector assemblies.

FIG. 11 is a front perspective view of the carrier assembly 110 and a plurality of the connector assemblies 114 mounted to a battery module 102. FIG. 11 illustrates the wire assemblies 118 at different orientations relative to the carrier assembly 110 than the embodiments illustrated in FIGS. 8 and 10. For example, FIG. 11 illustrates the wire assemblies 118 oriented parallel to each other and parallel to the cell stack-up direction 109. Other orientations are possible in alternative embodiments.

In the illustrated embodiment, the wire assemblies 118 include discrete wires forming a wire harness rather than the planar multi-wire cable. The discrete wires 140 may be held together by a securing mechanism 250, such as a clip, a wire tie or another securing mechanism, such that the wires 140 are gathered together and may be arranged generally parallel and co-planar such that the wire assembly 118 has a low profile. Optionally, multiple securing mechanisms 250 may be used at different depths from the connector 116. The wires 140 may be round wires or may be flat wires. The wires 140 are configured to be coupled to the buss bars 130 in the same manner as the planar multi-wire cable. For example, the strain relief tabs 138 may be used to fix the ends of the wires 140 to the buss bars 130 and then exposed ends of the wires 140 may be terminated to the voltage sensors 136, such as by welding thereto. The same buss bars 130 are able to be used with the discrete wires 140 of the wire harness as with the planar multi-wire cable.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A connector assembly for voltage monitoring battery cells of a battery module, the connector assembly comprising:
 a connector having a plurality of terminals; and
 a wire assembly extending from the connector along a wire axis, the wire assembly having a plurality of wires extending between a terminal end and a buss bar end, the terminal end being terminated to a corresponding terminal, the buss bar end being configured to be terminated to a voltage sensor associated with a corresponding buss bar of the battery module, the buss bar end being folded over such that the buss bar end extends at a transverse angle relative to the wire axis, the buss bar ends being staggered along the wire axis at different depths from the connector, the wires extending along parallel paths between the terminal ends and the corresponding fold over portions at the buss bar ends.

2. The connector assembly of claim 1, wherein each wire has a different length between the connector and the corresponding buss bar end.

3. The connector assembly of claim 1, wherein the wire assembly is a flat flexible cable having the plurality of the wires, the wires being flat conductors in a common jacket, the jacket being separable to separate the flat conductors from each other for routing the buss bar ends to the voltage sensors.

4. The connector assembly of claim 1, wherein the wire assembly includes a plurality of discrete wires between the terminals and the corresponding voltage sensors forming a wire harness.

5. The connector assembly of claim 1, wherein the buss bar ends have exposed conductors for termination to the voltage sensors and strain relief segments proximate the exposed conductors configured to be fixed to the buss bars by strain relief tabs of the buss bars to hold the exposed conductors relative to the buss bars for termination to the voltage sensors.

6. The connector assembly of claim 1, wherein a majority of the buss bar ends are folded over at least one other wire as the buss bar ends are routed to the corresponding voltage sensors.

7. The connector assembly of claim 1, wherein none of the buss bar ends pass over any other wires as the buss bar ends are routed to the corresponding voltage sensors.

8. The connector assembly of claim 1, wherein the wire axis of the wire assembly is angled non-parallel to a cell stack up direction of the battery cells.

9. The connector assembly of claim 1, wherein the planar cable is angled away from a second planar cable.

10. A carrier assembly for battery cells of a battery module, the carrier assembly comprising:
 a tray configured to be coupled to a top of the battery module over the battery cells, the tray holding a plurality of buss bars configured to electrically connect adjacent battery cells of the battery module, the buss bars having voltage sensors associated therewith, the buss bars having strain relief tabs extending therefrom proximate to the voltage sensors; and
 a connector assembly coupled to the tray, the connector assembly having a connector including a plurality of terminals and a wire assembly extending from the connector along a wire axis, the wire assembly having a plurality of wires extending between a terminal end and a buss bar end, the terminal end being terminated to a corresponding terminal, the buss bar ends being staggered along the wire axis at different depths from the connector, the buss bar ends each having a folded over portion being folded over on itself such that the buss bar ends extend at transverse angles relative to the wire axis to the corresponding voltage sensors, the buss bar ends being fixed relative to the voltage sensors of the buss bars by the strain relief tabs.

11. The carrier assembly of claim 10, wherein each wire has a different length between the connector and the corresponding buss bar end.

12. The carrier assembly of claim 10, wherein the wire assembly is a flat flexible cable having the plurality of the wires, the wires being flat conductors in a common jacket, the jacket being separable to separate the flat conductors from each other for routing the buss bar ends to the voltage sensors.

13. The carrier assembly of claim 10, wherein the wire assembly includes a plurality of discrete wires between the terminals and the corresponding voltage sensors forming a wire harness.

14. The carrier assembly of claim 10, wherein the wire axis of the wire assembly is angled non-parallel to a cell stack up direction of the battery cells.

15. The carrier assembly of claim 10, wherein the planar cable is angled away from a second planar cable.

16. A battery system comprising:
 a plurality of battery cells forming a battery module, the battery cells being stacked in a cell stack-up direction;
 a carrier assembly mounted to the battery module, the carrier assembly having a tray holding a plurality of buss bars for electrically connecting adjacent battery cells of the battery module, the buss bars having voltage sensors sensing a voltage of the corresponding buss bar; and a connector assembly coupled to the tray, the connector assembly having a connector including a plurality of terminals and a wire assembly extending from the connector along a wire axis, the wire assembly having a plurality of wires extending between a terminal end and a buss bar end, the terminal end being terminated to a corresponding terminal, the buss bar ends being staggered along the wire axis at different depths from the connector, the buss bar ends being folded over such that the buss bar ends extend at transverse angles relative to the wire axis to the corresponding voltage sensors, the wires extending along parallel paths between the terminal ends and the corresponding fold over portions at the buss bar ends, the buss bar ends being fixed relative to the voltage sensors of the buss bars by the strain relief tabs.

17. The battery system of claim 16, wherein each wire has a different length between the connector and the corresponding buss bar end.

18. The connector assembly of claim 1, wherein the buss bar end is folded over such that the buss bar end extends perpendicular relative to the wire axis.

19. The connector assembly of claim 1, wherein the folded over portion is folded over on itself.

20. The connector assembly of claim 1, wherein the buss bar end is separated from the wire assembly at the folded over portion.

* * * * *